(12) United States Patent
Cheng et al.

(10) Patent No.: US 12,476,406 B2
(45) Date of Patent: Nov. 18, 2025

(54) CONTACT WITH TWO RESILIENT ARMS MAKING FOUR ABUTTING POINTS WITH A SUBSTRATE HOLE

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Shan-Yong Cheng, New Taipei (TW); Ming-Lun Szu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 633 days.

(21) Appl. No.: 17/686,637

(22) Filed: Mar. 4, 2022

(65) Prior Publication Data
US 2022/0285874 A1    Sep. 8, 2022

(30) Foreign Application Priority Data
Mar. 5, 2021    (CN) .......................... 202110242300.0

(51) Int. Cl.
*H01R 13/41*    (2006.01)
*B23K 1/00*    (2006.01)
(Continued)

(52) U.S. Cl.
CPC ........... *H01R 13/41* (2013.01); *B23K 1/0016* (2013.01); *H01R 13/2442* (2013.01); *B23K 2101/36* (2018.08)

(58) Field of Classification Search
CPC .... H01R 13/40; H01R 13/402; H01R 13/405; H01R 13/41; H01R 13/02; H01R 13/22;
(Continued)

(56) References Cited

U.S. PATENT DOCUMENTS 7,497,700 B2 *  3/2009  Chen ...................... H01R 12/57
                                                            439/78
9,806,444 B1 * 10/2017  Ju ........................... H01R 12/57
(Continued)

FOREIGN PATENT DOCUMENTS

| CN | 109361091 A | 2/2019 |
| CN | 110416766 A | 11/2019 |
| TW | M394596 U | 12/2010 |

*Primary Examiner* — Abdullah A Riyami
*Assistant Examiner* — Amara Anderson
(74) *Attorney, Agent, or Firm* — Ming Chieh Chang

(57) ABSTRACT

A contact for mounting to a substrate includes: an intermediate portion; an upper contacting portion; a lower securing portion for being fitted into a hole of the substrate, the securing portion having a body and a pair of resilient arms; and a leg extending downward from the lower securing portion. Each resilient arm has a first section connected to the body and a second section angled relative to the first section. The pair of resilient arms form four abutting points, for contacting the hole, including a first abutting point defined at an intersection of the body and the first section of one resilient arm, a second abutting point defined at an intersection of the body and the first section of the other resilient arm, a third and a fourth abutting point defined at a free end of the second section of the two resilient arms respectively.

17 Claims, 10 Drawing Sheets

(51) Int. Cl.
*H01R 13/24* (2006.01)
*B23K 101/36* (2006.01)

(58) Field of Classification Search
CPC ............... H01R 13/24; H01R 13/2442; H01R 13/2457; H01R 13/2464; H01R 13/2492; H01R 12/712; H01R 12/716; H01R 12/718; B23K 1/0008; B23K 1/0016; B23K 2101/36; B23K 2101/42
USPC ....... 439/658, 66, 59, 79, 83, 82, 70, 71, 73
See application file for complete search history.

(56) References Cited

U.S. PATENT DOCUMENTS

| | | | | |
|---|---|---|---|---|
| 10,651,584 B2 * | 5/2020 | Hsu | ......................... | H01R 12/58 |
| 2003/0171040 A1 * | 9/2003 | Lei | ........................ | H01R 13/629 |
| | | | | 439/752.5 |
| 2004/0266227 A1 * | 12/2004 | Ma | ..................... | H01R 13/2442 |
| | | | | 439/71 |
| 2007/0149002 A1 * | 6/2007 | Liao | ........................ | H01R 12/52 |
| | | | | 439/71 |
| 2007/0224887 A1 * | 9/2007 | Liao | ................... | H01R 13/2435 |
| | | | | 439/660 |
| 2008/0119063 A1 * | 5/2008 | Yan | .................... | H01R 13/2442 |
| | | | | 439/744 |
| 2009/0269950 A1 * | 10/2009 | Liao | ................... | H01R 13/2492 |
| | | | | 439/76.1 |
| 2019/0245289 A1 * | 8/2019 | Wu | .................... | H01R 13/2442 |
| 2020/0021048 A1 * | 1/2020 | Tu | ......................... | H01R 12/57 |

* cited by examiner

CONTACT WITH TWO RESILIENT ARMS MAKING FOUR ABUTTING POINTS WITH A SUBSTRATE HOLE

BACKGROUND OF THE INVENTION

1. Field of the Invention

The present invention relates to a contact for mounting to a substrate, comprising an intermediate portion, an upper contacting portion, and a lower securing portion for being fitted into a hole of the substrate. The securing portion has a body and a pair of resilient arms bent from the body for contacting an inner wall surface of the hole of the substrate.

2. Description of Related Arts

China Patent No. 201112704 discloses a contact for mounting to a hole of a substrate, wherein the hole has a groove specially shaped to receive a securing portion of the contact.

U.S. Pat. No. 10,483,666 discloses a socket connector including a housing and a plurality of contacts mounted to the housing. The contact has a contact portion, a press-fit portion, and a solder-joint portion. The press-fit portion is inserted into a passageway of the housing and has an eye-of-needle shape. The width of the press-fit portion is slightly wider than the inner diameter of the passageway so the press-fit portion is elastically deformed by being pressed by an inner wall surface of the passageway. The solder-joint portion is soldered to a conductive pad of the housing after the press-fit portion is press-fitted into the passageway.

SUMMARY OF THE INVENTION

A contact for mounting to a substrate comprises: an intermediate portion; an upper contacting portion; a lower securing portion for being fitted into a hole of the substrate, the securing portion having a body and a pair of resilient arms bent from the body; and a leg extending downward from the lower securing portion, wherein: each resilient arm has a first section connected to the body and a second section angled relative to the first section; and the pair of resilient arms form four abutting points, for contacting the hole of the substrate, including a first abutting point defined at an intersection of the body and the first section of one resilient arm, a second abutting point defined at an intersection of the body and the first section of the other resilient arm, a third abutting point defined at a free end of the second section of one resilient arm, and a fourth abutting point defined at a free end of the second section of the other resilient arm.

DETAILED DESCRIPTION OF THE PREFERRED EMBODIMENTS

Figure 1:
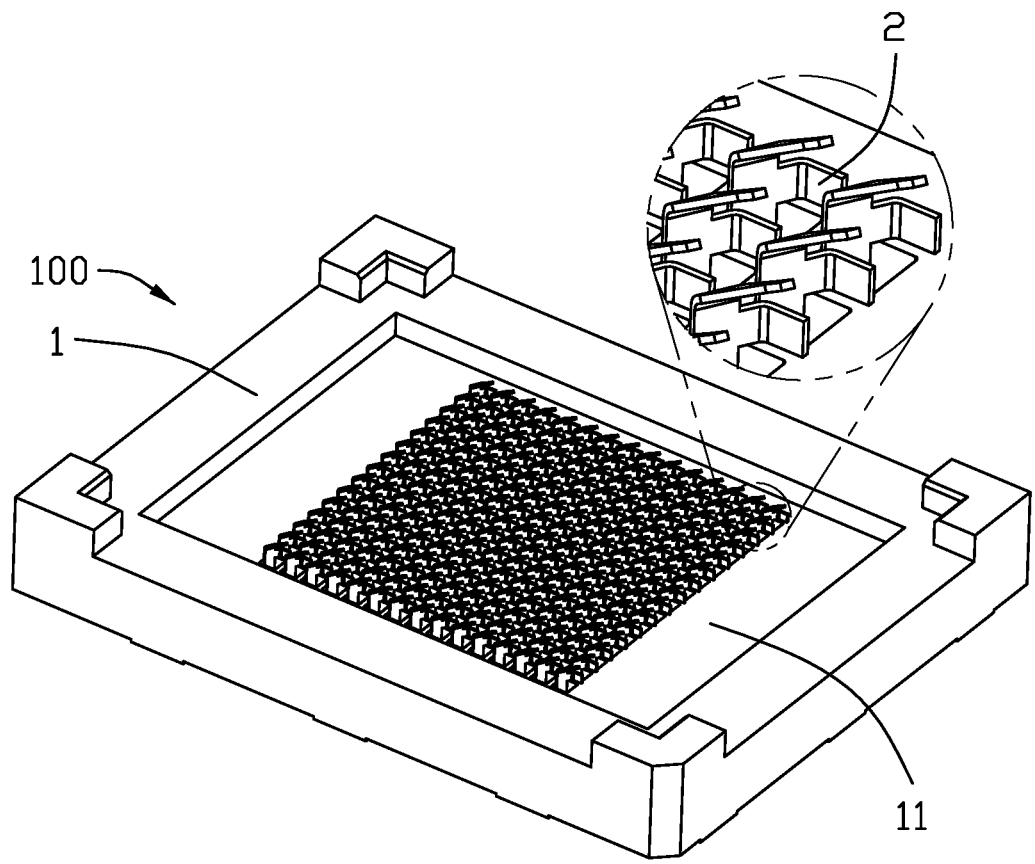
FIG. 1 is a top perspective view of an electrical connector in accordance with a first embodiment of the present invention.
Figure 2:
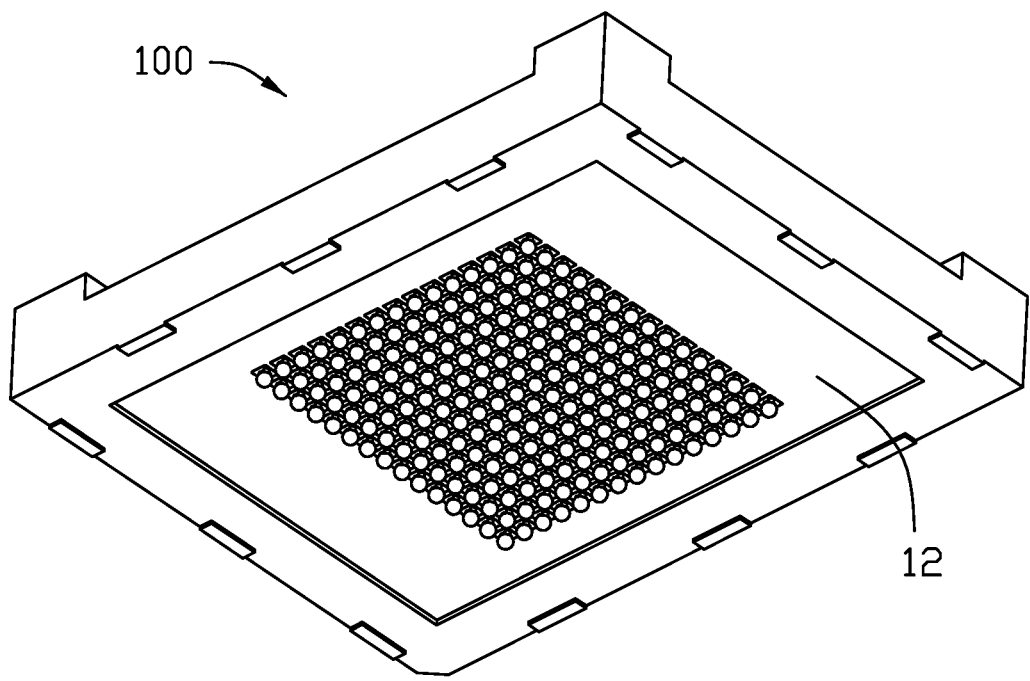
FIG. 2 is a bottom perspective view of the electrical connector.
Figure 3:
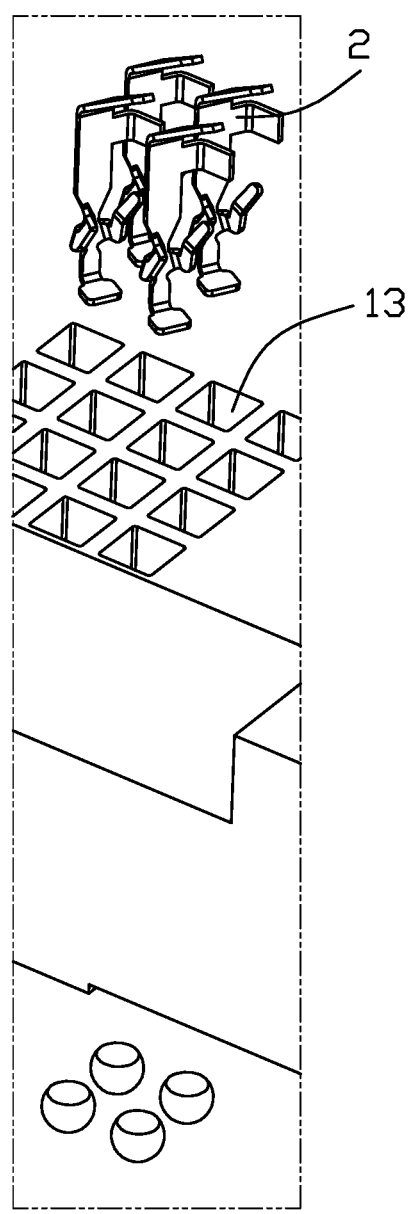
FIG. 3 is an exploded view showing a part of the electrical connector.
Figure 4:
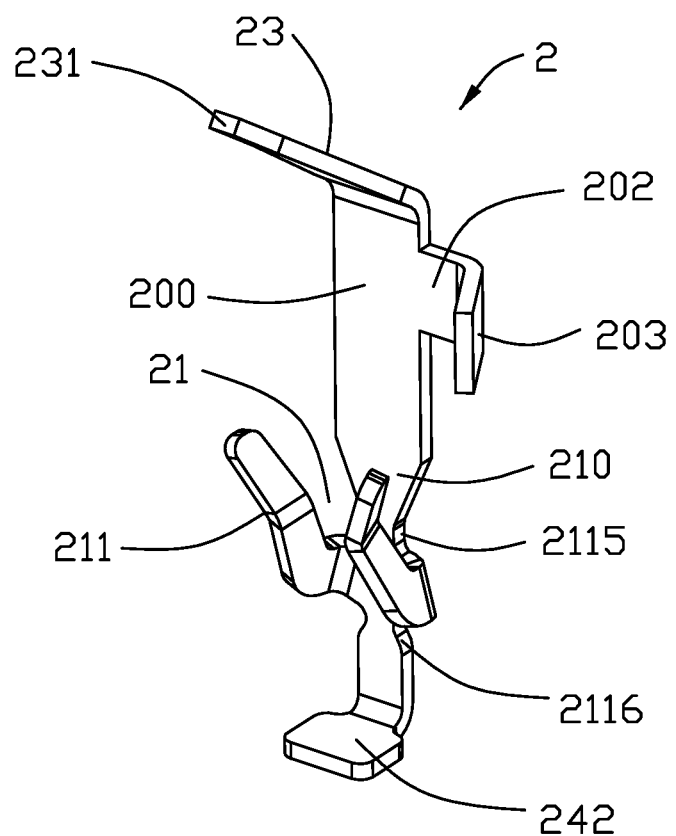
FIG. 4 is a perspective view of a contact in accordance with the present invention.
Figure 5:
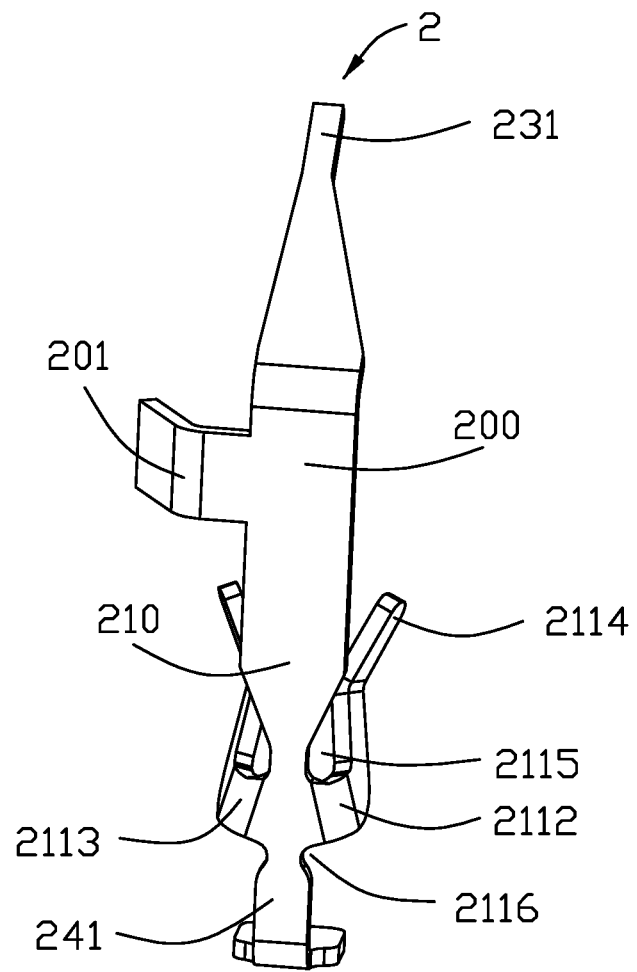
FIG. 5 is a further perspective view of the contact.
Figure 6:
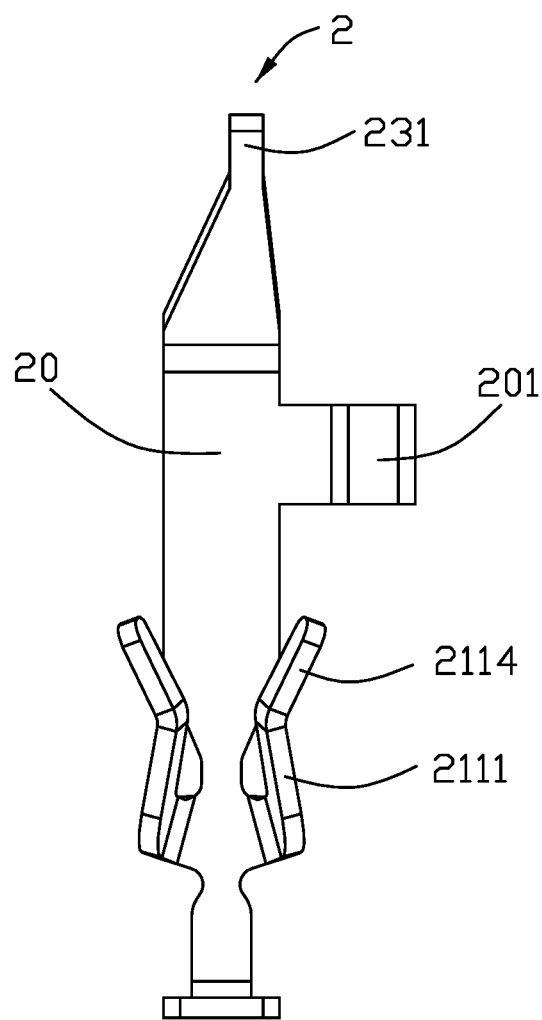
FIG. 6 is another perspective view of the contact.

Referring to FIGS. 1-7, an electrical connector 100 in accordance with the present invention is embodied as a socket connector for use with a central processing unit (CPU) chip module. The electrical connector 100 comprises a substrate 1 having a plurality of holes 13 and a plurality of contacts 2 mounted in corresponding holes 13 of the substrate arranged in rows and columns. Each hole 13 extends through opposite upper and lower surfaces 11 and 12 of the substrate 1. Each contact 2 includes an intermediate portion 20, an upper contacting portion 23, a lower securing portion 21 for being fitted into a corresponding hole 13 of the substrate 1, and a leg having an upper part 241 and a lower part 242. The intermediate portion 20 has a body 200 and a side extension 201 for seating upon the upper surface 11 of the substrate 1. The contacting portion 23 has an end 231 adapted to contact the CPU in a way and environment well known in this art. The securing portion 21 has a body 210 and a pair of resilient arms 211 bent from the body 210. The body 210 of the securing portion 21 is substantially planar and the pair of resilient arms 211 are bent to one side of the plane defined by the body 210.

Figure 7:
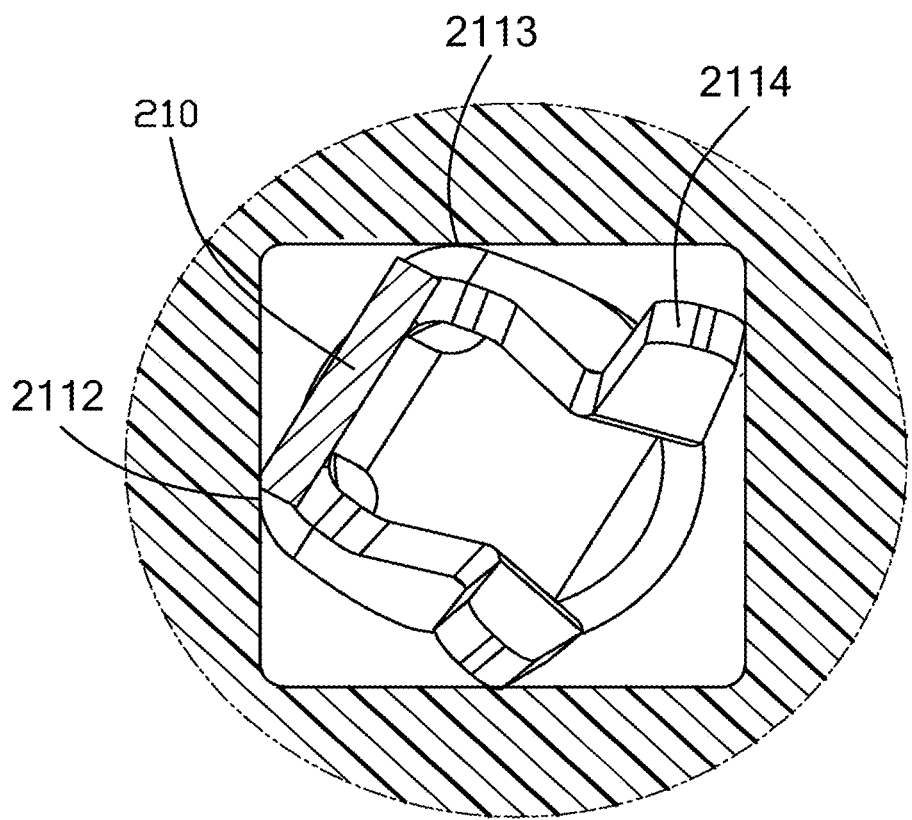
FIG. 7 is a cross-sectional view of the contact in a substrate hole.

Each resilient arm 211 has a first section 2111 connected to the body 210 and a second section 2114 continuing the first section 2111 and angled relative to the first section 2111. Each first section 2111 is bent along a line inclined relative to a vertical direction. Each of the first section 2111 and the second section 2114 is substantially planar. The pair of resilient arms 211 form four abutting points for contacting an inner wall surface of the substrate hole 13, namely, a first abutting point 2112 defined at an intersection of the body 210 and the first section 2111 of one resilient arm 211, a second abutting point 2113 defined at an intersection of the body and the first section 2111 of the other resilient arm 211, a third abutting point defined at a free end of the second section 2114 of one resilient arm 211, and a fourth abutting point defined at a free end of the second section 2114 of the other resilient arm 211. The first and second abutting points 2112 and 2113 at a lower level and the third and fourth abutting points at a higher level, together with the extension 201 of the intermediate portion 20, establish a structure that securely retains the contact 2 in the hole 13. The hole 13 of the substrate 1 may be of a plain shape such as cylindrical as shown in FIG. 7 or rectangular as shown in FIG. 10.

There is a respective notch 2115 at an upper region of the intersection of the body 210 and the first section 2111 of the resilient arm 211 and a respective notch 2116 at a lower region thereof. The side extension 201 of the intermediate portion 20 is originally connected to a contact carrier strip. The side extension 201 has a connecting part 202 coplanar with the body 200 and an end part 203 bent from the connecting part 202 so that the extension 201 is angled. The end part 203 is preferably bent toward the same side as the pair of resilient arms 211 are bent with respect to the plane defined by the body 210. The leg lower part 242 is preferably adapted for engaging a soldering ball in a manner well known in this art. The lower part 242 is also preferably bent from the leg upper part 241 to the same side of the body 210 as the pair of resilient arms 211 and the extension end part 203 are bent.

The contacts 2 are inserted into the holes 13 from an upper side of the substrate 1 with the side extensions 201 of the intermediate portions 20 still connected to a contact carrier. After insertion, the pair of resilient arms 211 make four abutting points with the hole 13 of the substrate 1, as shown in FIGS. 7 and 10. It is noted that although the extension 201 of the intermediate portion 20 is described as seating upon the upper surface 11 of the substrate 1, it is contemplated that this may not be necessary in other applications. In the embodiment of FIG. 7, the rectangular hole 13 defines a first, a second, a third, and a fourth wall faces, and the first through fourth abutting points engage the first through fourth wall faces, respectively.

Figure 8:
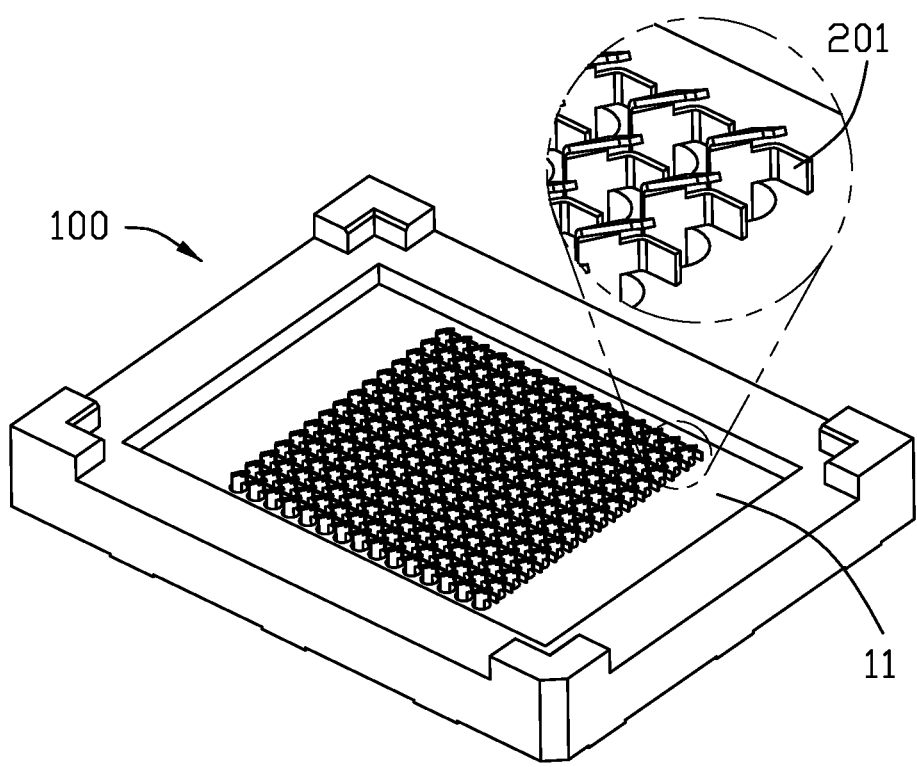
FIG. 8 is a top perspective view of an electrical connector in accordance with a second embodiment of the present invention.
Figure 9:
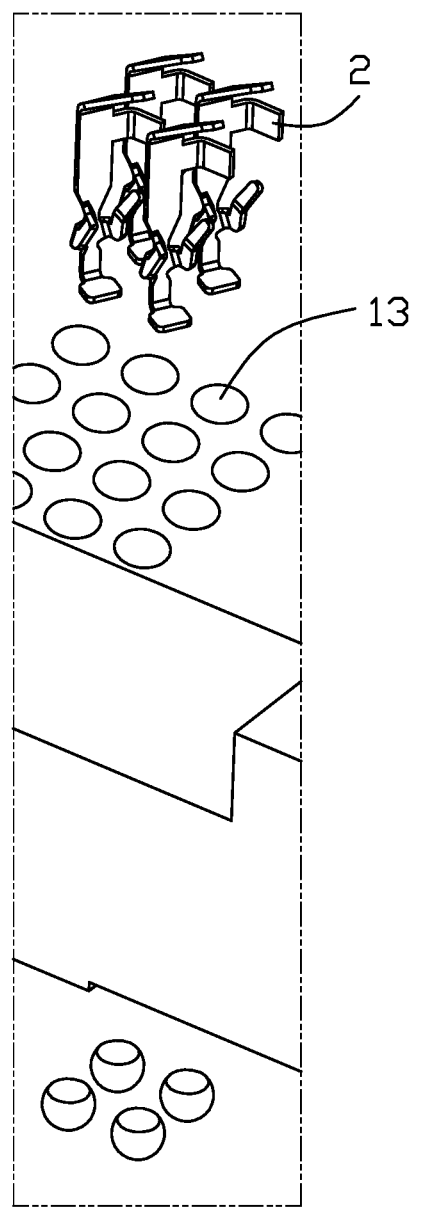
FIG. 9 is an exploded view showing a part of the electrical connector in FIG. 8.
Figure 10:
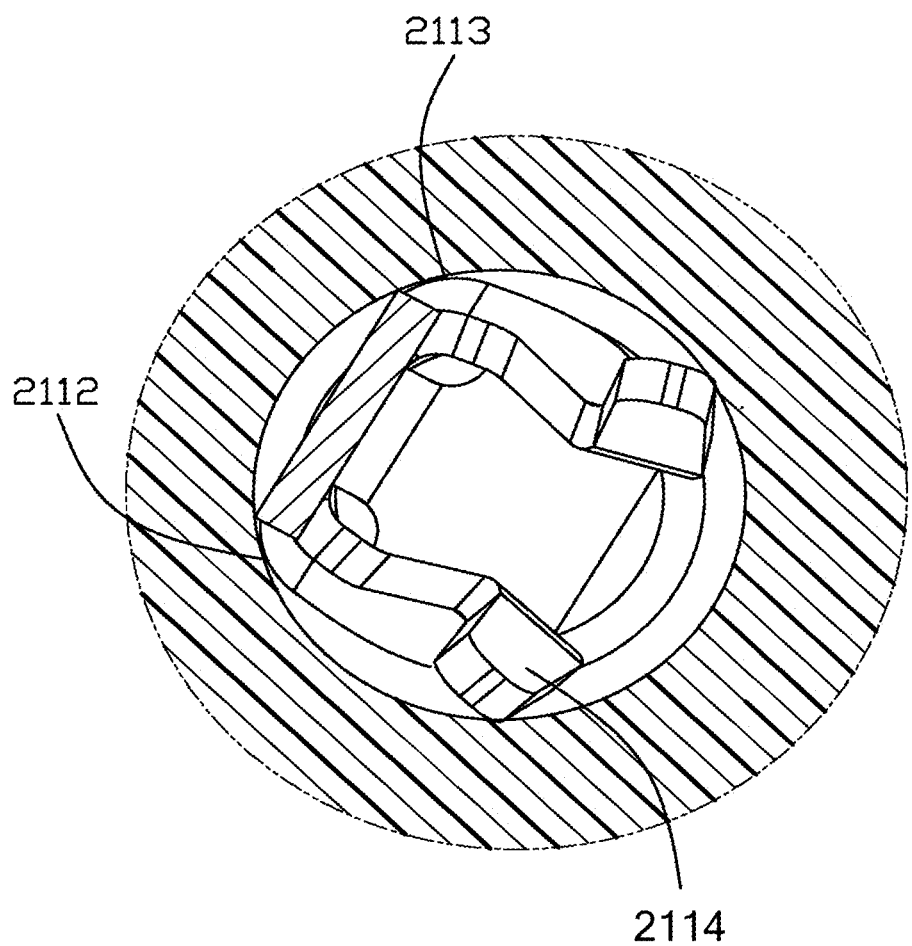
FIG. 10 is a view similar to FIG. 7 but showing the contact in a cylindrical substrate hole.

Referring specifically to FIGS. 8-10, an electrical connector 100 in a varied design in accordance with the present invention shows the hole 13 has a cross section in the shape of a circle instead of a rectangle or square, which are all unique in their simple shapes without any dedicated groove or slots.

What is claimed is:

1. A contact for mounting to a substrate, comprising:
   an intermediate portion;
   an upper contacting portion for engaging a conductive pad of an electronic module;
   a lower securing portion for being fitted into a hole of the substrate, the lower securing portion being distinct from the upper contacting portion and having a body and a pair of resilient arms bent from the body; and
   a leg extending downward from the lower securing portion; wherein
   each resilient arm has a first section connected to the body and a second section angled relative to the first section; and
   the pair of resilient arms form four abutting points for contacting the hole of the substrate, including a first abutting point defined at an intersection of the body and the first section of one resilient arm, a second abutting point defined at an intersection of the body and the first section of the other resilient arm, a third abutting point defined at a free end of the second section of one resilient arm, and a fourth abutting point defined at a free end of the second section of the other resilient arm.

2. The contact as claimed in claim 1, wherein each of the first section and the second section is substantially planar.

3. The contact as claimed in claim 1, wherein each first section is bent along a line inclined relative to a vertical direction.

4. The contact as claimed in claim 1, wherein the body of the lower securing portion is substantially planar, and the pair of resilient arms are bent to one side of a plane defined by the body.

5. The contact as claimed in claim 4, wherein the intermediate portion has an end part bent toward the same side as the pair of resilient arms are bent with respect to the plane defined by the body.

6. The contact as claimed in claim 1, wherein the intermediate portion has an extension for seating upon a surface of the substrate.

7. The contact as claimed in claim 6, wherein the extension of the intermediate portion is angled.

8. An electrical connector comprising:
   a substrate having a plurality of holes; and
   a plurality of contacts mounted in corresponding holes of the substrate, each contact including:
      an intermediate portion;
      an upper contacting portion for engaging a conductive pad of an electronic module;
      a lower securing portion for being fitted into a hole of the substrate, the lower securing portion being distinct from the upper contacting portion and having a body and a pair of resilient arms bent from the body; and
      a leg extending downward from the lower securing portion; wherein each resilient arm has a first section connected to the body and a second section angled relative to the first section; and
   the pair of resilient arms form four abutting points for contacting the hole of the substrate, including a first abutting point defined at an intersection of the body and the first section of one resilient arm, a second abutting point defined at an intersection of the body and the first section of the other resilient arm, a third abutting point defined at a free end of the second section of one resilient arm, and a fourth abutting point defined at a free end of the second section of the other resilient arm.

9. The electrical connector as claimed in claim 8, wherein the plurality of holes of the substrate comprises a cylindrical hole.

10. The electrical connector as claimed in claim 8, wherein the plurality of holes of the substrate comprises a rectangular hole.

11. The electrical connector as claimed in claim 10, wherein the rectangular hole defines a first, a second, a third, and a fourth wall faces, and the first through fourth abutting points engage the first through fourth wall faces, respectively.

12. The electrical connector as claimed in claim 8, wherein each of the first section and the second section is substantially planar.

13. The electrical connector as claimed in claim 8, wherein each first section is bent along a line inclined relative to a vertical direction.

14. The electrical connector as claimed in claim 8, wherein the body of the lower securing portion is substantially planar, and the pair of resilient arms are bent to one side of a plane defined by the body.

15. The electrical connector as claimed in claim 14, wherein the intermediate portion has an end part bent toward the same side as the pair of resilient arms are bent with respect to the plane defined by the body.

16. The electrical connector as claimed in claim 8, wherein the intermediate portion of the contact has an extension seated upon a surface of the substrate.

17. The electrical connector as claimed in claim 16, wherein the extension of the intermediate portion is angled.

* * * * *